(12) United States Patent
Perron et al.

(10) Patent No.: US 7,229,739 B2
(45) Date of Patent: Jun. 12, 2007

(54) POSITIVE WORKING THERMAL PLATES

(75) Inventors: Paul A. Perron, Springfield, MA (US); Brian L. Anderson, Westfield, MA (US); William J. Ryan, South Windsor, CT (US)

(73) Assignee: Anocoil Corporation, Rockville, CT (US)

( * ) Notice: Subject to any disclaimer, the term of this patent is extended or adjusted under 35 U.S.C. 154(b) by 126 days.

(21) Appl. No.: 11/137,179

(22) Filed: May 25, 2005

(65) Prior Publication Data

US 2006/0127802 A1 Jun. 15, 2006

Related U.S. Application Data

(60) Provisional application No. 60/636,246, filed on Dec. 15, 2004.

(51) Int. Cl.
 G03F 7/039 (2006.01)
 G03F 7/14 (2006.01)
 G03F 7/30 (2006.01)

(52) U.S. Cl. .................. 430/270.1; 430/302; 430/326; 430/330; 430/905; 430/909; 430/918; 430/964

(58) Field of Classification Search ............ 430/270.1, 430/302, 326, 330, 905, 909, 918, 964
See application file for complete search history.

(56) References Cited

U.S. PATENT DOCUMENTS

| | | | |
|---|---|---|---|
| 4,258,123 A | 3/1981 | Nagashima et al. ........ 430/281 |
| 4,523,208 A | 6/1985 | Barzynski .................... 346/214 |
| 4,598,138 A | 7/1986 | Lücke et al. ................. 528/205 |
| 5,698,362 A * | 12/1997 | Nishi et al. .................. 430/191 |
| 6,074,802 A | 6/2000 | Murata et al. ............ 430/270.1 |
| 6,090,532 A * | 7/2000 | West et al. .................. 430/326 |
| 6,100,008 A | 8/2000 | McMurdie |
| 6,171,735 B1 | 1/2001 | Li et al. ........................ 430/12 |
| 6,174,646 B1 | 1/2001 | Hirai et al. .................. 430/302 |
| 6,200,727 B1 | 3/2001 | Urano et al. ............. 430/270.1 |
| 6,232,031 B1 | 5/2001 | Gracia et al. ............... 430/165 |
| 6,326,122 B1 | 12/2001 | Nagasaka et al. ......... 430/270.1 |
| 6,410,207 B1 | 6/2002 | Nagasaka et al. ........... 430/302 |
| 6,596,457 B1 | 7/2003 | Hidaka et al. ........... 430/270.1 |
| 6,630,242 B1 | 10/2003 | Lin et al. ..................... 428/378 |
| 6,641,970 B2 | 11/2003 | Van Damme et al. ...... 430/164 |
| 2002/0042019 A1* | 4/2002 | Grober et al. ........... 430/270.1 |
| 2002/0146635 A1 | 10/2002 | Nagasaka et al. ........... 430/190 |

FOREIGN PATENT DOCUMENTS

EP 1464487 A2 6/2004

OTHER PUBLICATIONS

Andreou, A.G. and Wang J.; Lecture 5—Photolithography (II), Fall 2003.
Appendix I—Friction materials—Phenolic moulding compounds.
Conner, Anthony H.; Predicting the Reactivity of Phenolic Compounds with Formaldehyde Under Basic Conditions: An *Ab Initio* Study; Journal of Applied Polymer Science, Bol. 78, 355-363 (2000).
Reiser, Arnost; "The Molecular Mechanism of Novolak Resists"; Journal of Imaging Science and Technology, 42: 15-22 (1998).
Rowell, Roger M.; "Chemical Modification of Wood for Improved Adhesion in Composites"; USDA Forest Service, Forest Products Laboratory, Madison, Wisconsin.
Ryu, Chang Y.; http://block.chem.rpi.edu.
International Search Report for International Application No. PCT/US2005/009674 mailed on Aug. 3, 2005.
Database CA [Online] Chemical Abstracts Service, Columbus, Ohio, US; Feb. 16, 1993, Uchino, Shouichi et al: "Chemically amplified negative resists using acid-catalyzed etherification of carbinol" XP002337124 retrieved from STN Database accession No. 1993:69894.
Database WPI Section Ch, Week 199938 Derwent Publications, Ltd., London, GB; Class A89, AN 1999-134320 XP002337191 & JP 11 190903 A (Mitsubishi Chem Corp) Jul. 13, 1999.

\* cited by examiner

*Primary Examiner*—Richard L. Schilling
(74) *Attorney, Agent, or Firm*—Alix, Yale & Ristas, LLP

(57) ABSTRACT

The invention generally relates to positive-working coating compositions and to a substrate formed with a coating of that composition. Advantageous versions of the invention provide an infrared imageable, positive lithographic printing plate having a coating comprising a hydroxy substituted polymer, a diphenylcarbinol solubility suppressing compound and an infrared radiation absorbing compound.

21 Claims, No Drawings

POSITIVE WORKING THERMAL PLATES

FIELD OF THE INVENTION

This invention relates to a thermally sensitive composition and to a positive-working element using such a composition. More particularly, this invention relates to an infrared energy sensitive polymer resin composition and a positive-working lithographic printing plate coated with this composition that develops an image after exposure to energy in the infrared spectrum and subsequent development.

BACKGROUND OF THE INVENTION

Lithographic printing presses typically use a lithographic printing plate that is mounted on a cylinder of the printing press. The lithographic plate carries a lithographic image on its surface. The lithographic image consists of oleophilic (or hydrophobic, i.e. ink-accepting, water-repelling) areas as well as oleophobic (or, hydrophilic i.e. water-accepting, ink-repelling) areas. In conventional (so-called "wet") lithographic printing, ink as well as an aqueous solution are supplied to the lithographic plate. The ink is retained in the oleophilic areas and repelled in the oleophobic areas. The retained ink is transferred from the lithographic plate onto a receiver material, which is typically paper.

Most lithographic printing plates comprise a substrate having a radiation-sensitive coating applied thereto. These coatings can be selected to be sensitive to limited ranges of radiation including ultraviolet radiation, visible radiation or infrared radiation. Coating compositions are typically useful only within the limited range of wavelengths. The coating may react to the radiation such that the portions of the coating exposed to radiation become soluble in a developing solution. The solubilized portions are removed by soaking the exposed lithographic plate in a developing solution. Such plates are known as positive-working printing plates. On the other hand, the coating may react to the radiation such that the exposed areas become hardened and insoluble to developing solutions. The remaining unexposed, soluble portions are removed by soaking the exposed lithographic plate in a developing solution. Such plates are known as negative-working printing plates. Coating systems used in positive working plates typically are not useful in negative working plates and vice versa.

Positive working thermal printing plates useful within the infrared (IR) wavelength range typically employ a coating consisting of hydroxy substituted polymers, such as novolacs and/or resoles, and infrared (IR) absorbing dyes coated on a suitable lithographic substrate. When the lithographic plate is image-wise exposed to IR energy a solubility difference is generated such that the exposed areas show greater solubility in aqueous alkali developing solutions than the unexposed areas. Thus, after image-wise exposure to IR energy and development in an aqueous alkali developer, a positive image of oleophilic coating in the unexposed areas and hydrophilic lithographic substrate in the exposed areas is produced.

To enhance the solubility difference between exposed and unexposed areas additives, often referred to as solubility suppressors, are added to the coating. It has been theorized that the solubility suppressor generates secondary forces, such as hydrogen bonding, with the hydroxy groups on the polymer to further reduce the solubility of the coating in aqueous alkali developers. Upon image-wise exposure to IR energy, heat generated by the infrared absorbing dye disrupts these secondary forces restoring solubility in the aqueous alkali developer. No chemical bonds are formed between the solubility suppressor and the hydroxy substituted polymer and both the solubility suppressor and the hydroxy substituted polymer retain their chemical identity. One known class of solubility suppressing compounds is diazonaphthoquinone (DNQ) derivatives. These compounds are also sensitive to ultraviolet (UV) light. The mechanism through which UV exposure restores solubility to coatings containing DNQ's differs from the mechanism through which IR energy exposure restores solubility in that UV exposure of a coating containing DNQ causes chemical rearrangement of the DNQ. The chemically rearranged DNQ can no longer generate secondary forces with the hydroxy groups on the polymer and solubility of the coating in aqueous alkali developers is restored. The IR absorbing dye may also function as a solubility suppressing compound.

Despite the range of chemicals that function as solubility suppressors through secondary forces, presently known positive working thermal printing plates can be improved. On the one hand, plates can be produced which require high levels of IR energy exposure and/or extremely strong, difficult to control aqueous alkali developing solutions to ensure that all the coating is removed from the exposed areas, otherwise undesirable toning and tinting is encountered with these plates during the printing operation. On the other hand, plates can be produced which require lower levels of IR energy exposure and/or less strong, easier to control developing solutions to clean out the exposed area, but the unexposed areas are not sufficiently insolubilized to produce the required reproduction quality and/or number of printed copies. Additionally, lithographic plate latency is also of concern. Latency describes the amount of time that an exposed lithographic plate can be held before developing is necessary. Latency times vary depending on the coating system from less than 30 minutes to many hours. Maximum latency is desirable for lithographic plate coatings. A lithographic plate having improved processing requirements, reproduction quality, life and latency would be desirable.

SUMMARY OF THE INVENTION

The invention generally relates to positive-working coating compositions and to an article comprising a coating of that composition on a substrate. Advantageous versions of the invention provide an infrared imageable, positive lithographic printing plate having a coating comprising a hydroxy substituted polymer, a diphenylcarbinol solubility suppressing compound and an infrared radiation absorbing compound.

Advantageously, the polymer is a phenol formaldehyde novolac resin, a phenol formaldehyde resole resin or a polyvinyl resin with phenolic hydroxy groups. The preferred polymer may be a novolac and/or a resole.

Advantageously, the diphenylcarbinol solubility suppressing compound is bis-4,4' substituted. Preferably, the diphenylcarbinol solubility suppressing compound is bis-4,4' tertiary dialkylamino substituted.

The infrared radiation absorbing compounds useful in the invention are those which have an absorption wavelength that is at its maximum in the region above the visible or ultraviolet region, i.e. above about 750 nm. More particularly, the compounds have a maximum absorption wavelength from about 800 to about 1100 nm. In an advantageous embodiment of the invention the IR absorbing compound is non-ionic.

In an advantageous embodiment of the invention the inventive coating further comprises a diazonaphthoquinone (DNQ) derivative.

In an especially advantageous embodiment of the invention, the IR absorbing compound is a non-ionic dye and the inventive coating further comprises a diazonaphthoquinone (DNQ) derivative.

A preferred version of the invention comprises an infrared imageable, positive working lithographic printing plate having a coating comprising at least one of a novolac or a resole resin, a diphenylcarbinol solubility suppressing compound, a diazonaphthoquinone (DNQ) derivative and a non-ionic infrared radiation absorbing dye Unless otherwise specifically defined, "acyclic" refers to any acyclic carbon-containing compound having from 1 to about 16 carbon atoms, and advantageously about 1 to about 6 carbon atoms, including saturated compounds and, if possible, compounds unsaturated in any possible position. Unless otherwise specifically limited an any acyclic compound can be unsubstituted, singly substituted, or multiply substituted, with substituent groups in any possible position. Examples of acyclic compounds include, but are not limited to, alkanes, such as methyl, ethyl, propyl, 1-methylethyl, butyl, 1-methylpropyl, 2-methylpropyl, 1,1-dimethylethyl, pentyl, 1-methylbutyl, 2-methylbutyl, 1,2-dimethylpropyl, hexyl, decyl and hexadecyl; alkenes, such as vinyl, allyl, and propenyl; and alkynes, such as ethynyl and propynyl.

Unless otherwise specifically defined, "acyl" refers to the general formula —C(O)alkyl.

Unless otherwise specifically defined, "acyloxy" refers to the general formula —O-acyl.

Unless otherwise specifically defined, "alcohol" refers to the general formula -alkyl-OH and includes primary, secondary and tertiary variations.

Unless otherwise specifically defined, "alkoxy" refers to the general formula —O-alkyl.

Unless otherwise specifically defined, "alkyl" or "lower alkyl" refers to a linear or branched alkyl group having from 1 to about 16 carbon atoms, and advantageously about 1 to about 6 carbon atoms, including, for example, methyl, propyl, 1-methylethyl, 2-methylbutyl, 1,2-dimethylpropyl and hexadecyl. Unless otherwise specifically limited an alkyl group can be unsubstituted, singly substituted, or multiply substituted, with substituent groups in any possible position.

Unless otherwise specifically defined, "alkylmercapto" refers to the general formula —S-alkyl.

Unless otherwise specifically defined, "alkylamino" refers to the general formula —N(H)alkyl.

Unless otherwise specifically defined, an aromatic ring is an unsaturated ring structure having about 5 to about 7 ring members and including only carbon as ring atoms. Unless otherwise specifically defined, an aromatic ring can be unsubstituted, singly substituted, or multiply substituted, with substituent groups in any possible position.

Unless otherwise specifically defined, "aryl" refers to an aromatic ring system that includes only carbon as ring atoms, for example phenyl, biphenyl or naphthyl. Unless otherwise specifically limited an aryl moiety can be unsubstituted, singly substituted, or multiply substituted, with substituent groups in any possible position.

Unless otherwise specifically defined, "aroyl" refers to the general formula —C(O)aryl.

Unless otherwise specifically defined, a bicyclic ring structure comprises 2 fused or bridged rings that include only carbon as ring atoms. The bicyclic ring structure may be saturated or unsaturated. Unless otherwise specifically limited a bicyclic ring structure can be unsubstituted, singly substituted, or multiply substituted, with substituent groups in any possible position. The individual rings may or may not be of the same type. Examples of bicyclic ring structures include, Dimethyl-bicyclo[3,1,1]heptane, bicyclo[2,2,1]heptadiene, decahydro-naphthalene and bicyclooctane.

Unless otherwise specifically defined, a carbocyclic ring is a non-aromatic ring structure having about 3 to about 8 ring members, that includes only carbon as ring atoms, for example, cyclohexadiene or cyclohexane. Unless otherwise specifically limited a carbocyclic ring can be unsubstituted, singly substituted, or multiply substituted, with substituent groups in any possible position.

Unless otherwise specifically defined, a carbon ring structure refers to a cyclic structure having from 1 to about 16 ring members, and advantageously about 1 to about 6 ring members, that includes only carbon as ring atoms. Unless otherwise specifically defined, a carbon ring structure can be saturated, partially unsaturated or fully unsaturated. Unless otherwise specifically limited a carbon ring structure can be unsubstituted, singly substituted, or multiply substituted, with substituent groups in any possible position. Unless otherwise specifically limited, a carbon ring structure may include monocyclic, bicyclic, tricyclic, tetracyclic and polycyclic rings, for example norbornyl, adamantyl and related terpenes.

Unless otherwise specifically defined, "di-alkylamino" refers to the general formula —N(alkyl)$_2$. Unless otherwise specifically limited di-alkylamino includes cyclic amine compounds such as piperidine and pyrrolidine.

Unless otherwise specifically defined, "di-arylamino" refers to the general formula —N(aryl)$_2$.

Unless otherwise specifically defined, "halogen" refers to an atom selected from fluorine, chlorine, bromine and iodine.

Unless otherwise specifically defined, a heteroaromatic ring is an unsaturated ring structure having about 5 to about 8 ring members that have carbon atoms and one or more heteroatoms, including oxygen, nitrogen and/or sulfur, as ring atoms, for example, pyridine, furan, quinoline, and their derivatives. Unless otherwise specifically limited a heteroaromatic ring can be unsubstituted, singly substituted, or multiply substituted, with substituent groups in any possible position.

Unless otherwise specifically defined, a heterobicyclic ring structure comprises 2 fused or bridged rings that includes carbon and one or more heteroatoms, including oxygen, nitrogen and/or sulfur, as ring atoms. The heterobicyclic ring structure is saturated or unsaturated. The heterobicyclic ring structure can be unsubstituted, singly substituted, or multiply substituted, with substituent groups in any possible position. The individual rings may or may not be of the same type. Examples of heterobicyclic ring structures include tropane, quinuclidine and tetrahydro-benzofuran.

Unless otherwise specifically defined, a heterocyclic ring is a saturated ring structure having about 3 to about 8 ring members that have carbon atoms and one or more heteroatoms, including oxygen, nitrogen and/or sulfur, as ring atoms, for example, piperidine, morpholine, piperazine, pyrrolidine, thiomorpholine, tetrahydropyridine, and their derivatives. The heterocyclic ring can be unsubstituted, singly substituted, or multiply substituted, with substituent groups in any possible position.

Unless otherwise specifically defined, a heterotricyclic ring structure comprises 3 rings that may be fused, bridged or both, and that includes carbon and one or more heteroatoms, including oxygen, nitrogen and/or sulfur, as ring atoms. The heterotricyclic ring structure can be saturated or unsaturated. The heterotricyclic ring structure can be unsubstituted, singly substituted, or multiply substituted, with substituent groups in any possible position. The individual rings may or may not be of the same type. Examples of heterotricyclic ring structures include 2,4,10-trioxaadamantane, tetradecahydro-phenanthroline.

Unless otherwise specifically defined, a heteropolycyclic ring structure comprises more than 3 rings that may be fused, bridged or both and that includes carbon and one or more heteroatoms, including oxygen, nitrogen and/or sulfur, as ring atoms. The heteropolycyclic ring structure can be saturated or unsaturated. The heteropolycyclic ring structure can be unsubstituted, singly substituted or, if possible, multiply substituted, with substituent groups in any possible position. The individual rings may or may not be of the same type. Examples of heteropolycyclic ring structures include azaadamantine, 5-norbornene-2,3-dicarboximide.

Unless otherwise specifically limited a novolac is a phenol formaldehyde resin or a substituted phenol formaldehyde resin made using an acidic catalyst and a phenol to formaldehyde ratio of greater than 1.

Unless otherwise specifically defined, the term "phenacyl" refers to the general formula -phenyl-acyl.

Unless otherwise specifically defined, the term "phenol" refers to the general class of aromatic organic compounds in which one or more hydroxy groups are attached directly to a benzene ring. Phenols can be unsubstituted, singly substituted or, if possible, multiply substituted, with substituent groups in any possible position. Examples of phenols include benzophenol, cresols, xylenols, resorcinol and napthols.

Unless otherwise specifically defined, a polycyclic ring structure comprises more than 3 rings that may be fused, bridged or both fused and bridged and that include carbon as ring atoms. The polycyclic ring structure can be saturated or unsaturated. Unless otherwise specifically limited a polycyclic ring structure can be unsubstituted, singly substituted, or multiply substituted, with substituent groups in any possible position. The individual rings may or may not be of the same type. Examples of polycyclic ring structures include adamantine, bicyclooctane, norbornane and bicyclononanes.

Unless otherwise specifically limited a resole is a phenol formaldehyde resin or a substituted phenol formaldehyde resin made using a basic catalyst and a phenol to formaldehyde ratio of less than 1.

Unless otherwise specifically defined, a tricyclic ring structure comprises 3 rings that may be fused, bridged or both fused and bridged and that includes carbon as ring atoms. The tricyclic ring structure can be saturated or unsaturated. The tricyclic ring structure can be unsubstituted, singly substituted, or if possible, multiply substituted, with substituent groups in any possible position. The individual rings may or may not be of the same type. Examples of tricyclic ring structures include fluorene and anthracene.

Unless otherwise specifically limited the term "substituted" means substituted by at least one substituent group in any possible position or positions. Substituent groups useful in the invention are those groups that do not significantly diminish the desired activity of the inventive compound. Substituent groups that do not significantly diminish the activity of the inventive compound are expected to include, for example, H, halogen, $N_3$, NCS, CN, $NO_2$, $NX_1X_2$, $OX_3$, $C(X_3)_3$, OAC, O-acyl, OC(O)acyclic, O-aroyl, NH-acyl, NH-aroyl, NHCOalkyl, NHCOacyclic, CHO, C(halogen)$_3$, $COOX_3$, $SO_3H$, $PO_3H_2$, $SO_2NX_1X_2$, $CONX_1X_2$, $COCF_3$, alkyl, acyclic, alcohol, acyclic-OH, alkoxy, —O-acyclic, alkylmercapto, acyclicmercapto, alkylamino, —N(H)acyclic, di-alkylamino, —N(acyclic)$_2$, sulfonamide, thioalkoxy or —S-acyclic, wherein $X_1$ and $X_2$ each independently comprise H, alkyl or acyclic, or $X_1$ and $X_2$ together comprise part of a heterocyclic ring having about 4 to about 7 ring members and optionally one additional heteroatom selected from O, N or S, or $X_1$ and $X_2$ together comprise part of an imide ring having about 5 to about 6 members and $X_3$ comprises H, alkyl, acyclic, alcohol, acyclic-OH, alkyl-$NX_1X_2$ or acyclic-$NX_1X_2$. Unless otherwise specifically limited, a substituent group may be in any possible position or any possible positions if multiply substituted.

The inventive compounds include any and all isomers and stereoisomers. In general, the compositions of the invention may be alternately formulated to comprise, consist of, or consist essentially of, any appropriate components herein disclosed. The compositions of the invention may additionally, or alternatively, be formulated so as to be devoid, or substantially free, of any components, materials, ingredients, adjuvants or species used in the prior art compositions or that are otherwise not necessary to the achievement of the function and/or objectives of the present invention.

A better understanding of the invention will be obtained from the following detailed description of the presently preferred, albeit illustrative, embodiments of the invention.

DETAILED DESCRIPTION

The coating of the invention is particularly suitable for grained and anodized aluminum lithographic printing plates and the invention will be described in that environment. However, it is recognized that the coating can be used with other substrates in other infrared energy imaging applications such as imageable precursors for printed circuit boards. With respect to lithographic printing plates, the substrate is most commonly a conventional grained and anodized aluminum substrate although other metal substrates can be used. For a teaching of one type of graining process, see U.S. Pat. No. 4,183,788 to Fromson et al. and for a teaching of anodizing see U.S. Pat. No. RE 29754 to Fromson.

The base component of the inventive coating is a film-forming resin of the type normally used for positive working lithographic printing plate coatings. These resins are light stable and water insoluble, but are soluble in aqueous alkali solutions. The typical resins are polyhydroxy polymers capable of forming hydrogen bonds with diphenylcarbinol derivatives. The resins include phenol formaldehyde novolac resins, phenol formaldehyde resole resins and polyvinyl resins with phenolic hydroxide groups. Novolac resins such as phenol formaldehyde resin and cresol formaldehyde resin are presently preferred.

The coating of the invention comprises suitable organic solvents and uses conventional preparation and coating procedures and equipment. Examples of suitable solvents include propylene glycol monomethyl ether (Arcosolv PM), dimethylformamide (DMF), methyl ethyl ketone (MEK) and ethanol. The weight of the coating after drying on the substrate can be selected to vary widely but it is typically in the range of 100 to 300 mg/square foot, preferably 150 to 200 mg/square foot.

The plates of this invention are imageable using known digital laser imaging equipment. Following laser imaging, the element or plate is developed in a developing solution to remove the solubilized coating in the laser imaged, non-printing areas. Presently, the typically used developer solution comprises an alkaline, aqueous solution of silicates and hydroxides. While such alkaline developer solutions are presently used the invention also encompasses the use of other types of developing solutions, including non-alkaline developing solutions, that will satisfactorily remove the solubilized coating in the non-printing areas.

The inventive coating further comprises a diphenylcarbinol derived solubility suppressor. The diphenylcarbinol derivative lessens solubility of the coating to aqueous, alkali developing solutions. Some diphenylcarbinol compounds useful in the invention are illustrated in the structure below:

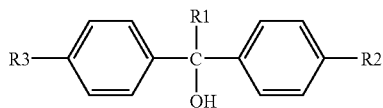

R1 comprises H, alkyl or acyclic. R2 and R3 each independently comprise H, NO$_2$, alkyl, acyclic, alkoxy, —O-acyclic, amino, alkylamino, —N(H)acyclic, dialkylamino, —N(acyclic)$_2$, aryl, arylamino, diarylamino, a carbon ring structure, a carbocyclic ring, a heterocyclic ring or a heteroaromatic ring. Advantageously R2 and R3 each independently comprise alkyl, acyclic, aryl, alkoxy, amino or dialkylamino.

The currently preferred diphenylcarbinol compound is 4,4'-bis(dimethylamino)benzhydrol, which has the following structure.

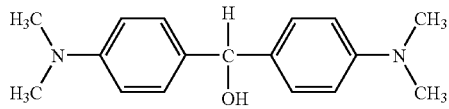

While the exact route by which these diphenylcarbinol compounds function has not been unequivocally proven, the inventors believe that two different but contemporaneous mechanisms may be present: 1) secondary forces such as hydrogen bonding with hydroxy groups of the resin and 2) a chemical change (loss of water) occurring as the diphenylcarbinol compound insolubilizes the resin coating. Exposure of the inventive coating to IR energy results not only in the disruption of the secondary forces between the diphenylcarbinol compound and hydroxy groups on the polymer, but also a chemical change, regeneration of the diphenylcarbinol compound through the addition of water. This dual mechanism makes insolubilization and solubilization after image-wise exposure to IR energy of the resin to aqueous alkali developing solutions more predictable and controllable than coating systems that rely on secondary forces alone. This enhanced predictability and controllability allows the formulation and manufacture of lithographic plate coatings which beneficially: do not require high levels of IR energy exposure and/or excessively strong, difficult to control aqueous alkali developing solutions to ensure adequate removal of the exposed coating; maintain good reproduction quality; and provide an acceptable number of printed impressions by the unexposed coating.

The postulated mechanisms by which the diphenylcarbinol compounds function was deduced from observations made when the preferred diphenylcarbinol compound, e.g. bis-4,4'-bis(dimethylamino)benzhydrol (Michler's hydrol or MH) was employed as the solubility suppressor. Bis-4,4'-bis(dimethylamino)benzhydrol is colorless. Upon the loss of water it turns a bright green as resonance through the central carbon atom and the aromatic rings becomes possible. As prepared the inventive coating composition (phenol formaldehyde resin, bis-4,4'-bis(dimethylamino)benzhydrol and IR absorbing dye) shows only the weak color of the IR absorbing dye. When the coating is first applied to the substrate to produce a lithographic plate, the plate is only very weakly colored. As the coating dries, the bis-4,4'-bis(dimethylamino)benzhydrol interacts with the resin hydroxy groups through secondary forces and also chemically changes by lose of water and the plate becomes bright green in color. Advantageously, the bis-4,4'-bis(dimethylamino)benzhydrol functions both as the solubility suppressor and colorant in the coating. When the plate is image-wise exposed, the exposed area not only regains solubility in aqueous alkali developing solutions, but also loses color, indicating that the secondary forces are disrupted and that the bis-4,4'-bis(dimethylamino)benzhydrol is chemically regenerated by addition of water. These observations indicate that two changes, a physical change (secondary forces) and a chemical change (loss or addition of water) occur in the inventive coating.

The unique and surprising characteristics of diphenylcarbinol compounds are further evidenced by comparing their action to a triphenylcarbinol analog. Bis-(4-[dimethylamino]phenyl)-phenylcarbinol (malachite green carbinol base, MGCB) is a triphenylcarbinol analog to bis-4,4'-bis(dimethylamino)benzhydrol having the following structure.

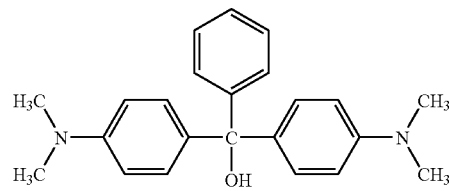

Like bis-4,4'-bis(dimethylamino)benzhydrol, MGCB is a colorless compound, which becomes colored through the loss of water, which allows resonance through the central carbon atom and the aromatic rings. As prepared a coating composition (phenol formaldehyde resin, MGCB and IR absorbing dye) shows only the weak color of the IR absorbing dye. When this coating is first applied to a substrate to produce a lithographic plate, the plate is only very weakly colored. As the coating dries, the MGCB interacts with the resin hydroxy groups through secondary forces and also loses water and the plate becomes bright green in color. This effect of MGCB is similar to the effect of bis-4,4'-bis(dimethylamino)benzhydrol. Upon exposure to IR energy however, while an increase in solubility occurs due to the disruption of the secondary forces, no color change occurs indicating that the addition of water to regenerate the colorless MGCB has not occurred. Thus there is no combined chemical change and physical change upon IR energy exposure when MGCB is employed as the solubility suppressor. When MGCB is used as a solubility suppressor the solubility increase of the exposed resin is less predictable and controllable than a similar resin in which a diphenylcarbinol compound is used as the solubility suppressor. This can be seen from the results of EXAMPLE 1 comparing the properties of lithographic plates where the only difference in the coating is equimolar substitution of MGCB for bis-4,4'-bis(dimethylamino)benzhydrol. The plates produced using bis-4,4'-bis(dimethylamino)benzhydrol as a solubility suppressor have better useable reproduction quality, better image durability and better non-image area properties over a much wider range of manufacturing conditions, accelerated aging conditions (indicative of product shelf life) and plate developing conditions as compared to the plates made using MGCB as a solubility suppressor.

Having generally described the invention, the following examples are included for purposes of illustration so that the invention may be more readily understood and are in no way intended to limit the scope of the invention unless otherwise specifically indicated. Unless otherwise indicate all amounts are in grams.

EXAMPLE 1

Test Comparing a Diphenylcarbinol Compound as a Solubility Suppressor to a Triphenylcarbinol Compound as a Solubility Suppressor.

The following stock solution is prepared.

| Chemical | Amount |
|---|---|
| propylene glycol monomethyl ether (Arcosolv PM) | 679.84 |
| dimethylformamide (DMF) | 64.00 |
| ethanol | 504.00 |
| HPN (44.6% solids in PM) | 265.60 |
| BYK 344 (50% solids in toluene) | 1.28 |
| KF 1151 | 3.04 |
| Total | 1517.76 |

HPN is a novolac polymer purchased from Clariant Gmbh. BYK 344 is a surfactant purchased from BYK Chemie. KF 1151 is 2-[2-[2-chloro-3-[2-(1,3-dihydro-1,1,3-Trimethyl-2H-benzo[e]-indol-2-ylidene)-ethylidene]-1-cyclohexen-1-yl]-11,3-Trimethyl-1H-benzo[e]indolium-4-methylbenzene-sulfonate, a cationic IR absorbing dye purchased from Honeywell Specialty Chemicals.

From the stock solution the following coating solutions are prepared.

Coating Solution 1—4,4'-bis(dimethylamino)benzhydrol, (MH), a Diphenylcarbinol Compound, as the Solubility Suppressor

| Component | Amount |
|---|---|
| Stock Solution | 94.86 |
| Arcosolv PM | 5.03 |
| MH | 0.11 (4.07 × 10$^{-4}$ moles) |
| Total | 100.00 |

Coating Solution 2—bis-(4-[dimethylamino]phenyl)-phenylcarbinol, (MGCB), a Triphenylcarbinol Compound, as the Solubility Suppressor

| Component | Amount |
|---|---|
| Stock solution | 94.86 |
| Arcosolv PM | 5.00 |
| MGCB | 0.14 (4.07 × 10$^{-4}$ moles) |
| Total | 100.00 |

The only color seen in either coating solution is the color of the KF 1151 IR absorbing dye. Both are coated on Anocoil NPT grained and anodized lithographic printing plate aluminum substrate with a #14 coating rod. The only color seen after either coating solution is applied to the substrate is the color of the KF 1151 IR absorbing dye.

Plates A coated with coating solution 1 were dried for 4 minutes at 100° C. The dried plates are a bright green color, indicating that the diphenylcarbinol compound has lost water to produce a colored dye. Coating weights of the dried plates are 200+/−4 mg/square foot. A set of plates coated with coating solution 1 were also dried for 6 minutes at 100° C., producing the same coating weight. These plates were also bright green in color after drying.

Plates B coated with coating solution 2 were dried for 4 minutes at 100° C. The dried plates are a bright green color, indicating that the triphenylcarbinol compound has lost water to produce a colored dye. Coating weights of the dried plates are 200+/−4 mg/square foot.

One plate coated with each solution was exposed to IR energy on a Creo 2400 dpi Trendsetter at 250 rpm and 10 watts. This is an approximate 100 mj/square centimeter exposure. Plate B made using coating solution 2 (MGCB) showed no visible evidence of having been exposed, that is the exposed and unexposed areas all were the same color indicating that no regeneration of MGCB through the addition of water occurred. Plate A made using coating solution 1 (MH) at either drying condition did show visible evidence of having been exposed. The exposed areas were distinctly lighter in color than the unexposed areas, indicating that the IR exposure had regenerated the diphenylcarbinol compound through addition of water.

The exposed plates were then developed through a CA Systems MX-33 processor with Anocoil T4 plate developer (an aqueous alkali plate developer) at 24° C. with a 19 second dwell time.

The non-image (exposed) areas of the developed plates were measured on an X-Rite model SP-64 spectrophotometer and the a* value on the L* a* and b* scale recorded. The L* a* and b* system was recommended by the Commission Inernationale du l'Eclariage (CIE) as a method to describe color and is an internationally recognized color measurement system. L* designates lightness where 100 represents white and 0 represents black. The a* value indicates red with positive values and green with negative values. The b* value indicates yellow with positive values and blue with negative values. The present EXAMPLES employ the a* reading to measure retained coating in the non-image areas of a plate. Typically, an a* reading more negative than −1.00 (for example −1.1, −1.2) indicates a marginal level of retained coating and an a* reading more negative than −1.50 (for example −1.6, −1.7) is unacceptable.

|  | a* Value | |
| --- | --- | --- |
| Plate | 4 Min Dry | 6 Min Dry |
| A (diphenylcarbinol) | −0.47 | −0.48 |
| B (MGCB) | −1.34 | — |

Plates A made with coating solution 1 (MH) at either drying condition showed excellent non-image area properties as seen by a* values of −0.47 and −0.48 and clean dry ink test results. Plates B produced with coating solution 2 (MGCB) produced only a marginally acceptable non-image (exposed area) as indicated by an a* value of −1.34.

The marginal acceptability of the non-image (exposed area) of plate B produced with coating solution 2 (MGCB) was also indicated by slight retention of ink in that area after a dry inking test (the dry plate is rubbed with black newspaper ink, rinsed with water and rubbed with a wet cotton rag. After rubbing, the non-image area of the plate is visually inspected for ink retention.).

Plates made using coating solutions 1 and 2 were stored at 50° C. for 64 hours to simulate approximately 12 months storage at ambient conditions. The plates were then exposed and developed as above. Plate D made with coating solution 2 (MGCB) showed no visible evidence of exposure. Plate C made with coating solution 1 (MH) at either drying condition showed distinctly lighter color in the exposed area.

|  | a* Value | |
| --- | --- | --- |
| Plate | 4 Min Dry | 6 Min Dry |
| C (diphenylcarbinol) | −0.52 | −0.55 |
| D (MGCB) | −6.53 | — |

After heated storage the plate made with coating solution B (MGCB) showed totally unacceptable non-image area properties with an a* value of −6.53 and a heavily stained dry ink test result. Additionally, reproduction of 30, 50 and 70% 100LPI screens showed unacceptable gain. After heated storage the plate made with coating solution 1 (MH) at either drying condition showed excellent non-image area properties with an a* value of −0.52 and −0.55 respectively and clean dry ink test results. Additionally reproduction of 30, 50 and 70% 100 LPI screens showed virtually no gain.

These test results clearly show that the use of 4,4'-bis(dimethylamino)benzhydrol as the solubility suppressing compound relative to MGCB provides better imaging results and has greater latitude with respect to both drying conditions of the coating and storage conditions of the resulting plate. This is the result of both a physical change (disruption of secondary forces) and a chemical change (regeneration of the 4,4'-bis(dimethylamino)benzhydrol through addition of water) during IR energy exposure. The superiority of diphenylcarbinol compounds as solubility suppressors is also shown in EXAMPLE 2.

EXAMPLE 2

Test Comparing Diphenylcarbinol Solubility Suppressor with 4,4'-Dimethylamino Groups to Other 4,4'-Dimethylamino Group Containing Non-Diphenylcarbinol Solubility Suppressors NOTE: As most of the other solubility suppressors do not produce a colored plate, it is necessary to add a colorant (KR 700) to the coating. PS 105, a diazonaphthoquinone (DNQ), is also in the coating.

The following stock solution is prepared.

| Chemical | Amount |
| --- | --- |
| Arcosolv PM | 679.84 |
| DMF | 64.00 |
| Ethanol | 504.00 |
| HPN (44.6% in PM) | 265.60 |
| BYK 344 | 1.28 |
| KF 1151 | 3.04 |
| PS 105 | 3.04 |
| KR 700 | 2.20 |
| Total | 1532.20 |

PS 105 is an ester of 1,2-naphthoquinone-(2)-diazido-5-sulfonic acid with a p-cresol resin manufactured by Koyo Chemicals Inc. KR 700 is 50% Acid Blue 5 in a proprietary blend of other components manufactured by Koyo Chemicals Inc. All other materials have been previously described.

Coatings are prepared from the stock solution per the following.

| Component | Amount |
| --- | --- |
| Stock Solution | 95.20 |
| Solubility suppressor | $4.07 \times 10^{-4}$ moles |
| Arcosolv PM | to 100.00 |

| Coating | Solubility Suppressor | Amount |
| --- | --- | --- |
| E | 4,4'-bis(dimethylamino)benzhydrol (diphenylcarbinol, MH) | 0.11 |
| F | bis-(4-[dimethylamino]phenyl)-phenylcarbinol (MGCB) | 0.14 |
| G | 4,4'-bis(dimethylamino)benzophenone | 0.11 |
| H | 4,4'-methylenebis(N,N-dimethylaniline) | 0.10 |
| I | N,N,N',N'-tetramethylbenzidine | 0.10 |
| J | 4,4'-vinylidenebis(N,N-dimethylaniline) | 0.11 |

Plates were coated with each coating and dried for 4 and 6 minutes at 100° C. Plates were exposed and developed and the a* values measured as in EXAMPLE 1. Results are as follows.

|  | a* Value | |
| --- | --- | --- |
| Plate | 4 Min Dry | 6 Min Dry |
| E (diphenylcarbinol) | −0.75 | −0.85 |
| F (MGCB) | −2.66 | −5.56 |
| G | −0.95 | −1.26 |

-continued

| Plate | a* Value | |
|---|---|---|
| | 4 Min Dry | 6 Min Dry |
| H | −1.06 | −1.76 |
| I | −0.95 | −1.26 |
| J | −0.92 | −1.52 |

As previously described, an a* value more negative than −1 is marginal while an a* value more negative than −1.5 is unacceptable. The data shows that diphenylcarbinol provides surprisingly better a* values over a range of drying conditions than other solubility suppressing compounds having 4,4'-dimethylamino groups. The values for the diphenylcarbinol comprising coating also indicate surprisingly improved manufacturing latitude as compared to coatings comprising other 4,4'-dimethylamino group containing non-diphenylcarbinol solubility suppressing compounds.

EXAMPLE 3

Test Comparing Other Diphenylcarbinol Solubility Suppressors to 4,4'-bis(dimethylamino)benzhydrol (MH)

Additional coatings were made per Example 2 with other diphenylcarbinol solubility suppressors.

| Coating | Solubility Suppressor | Amount |
|---|---|---|
| K | benzhydrol | 0.08 |
| L | 4,4'-dimethoxybenzhydrol | 0.10 |

Plates were coated, exposed and developed and a* values measured as in EXAMPLE 1.

| Plate | a* Value | |
|---|---|---|
| | 4 Min Dry | 6 Min Dry |
| K | −0.81 | −0.94 |
| L | −0.78 | −0.88 |

The a* value with these other diphenylcarbinol solubility suppressors are acceptable at both drying conditions. The diphenylcarbinol compounds (K–L) are also superior to coatings comprising 4,4'-dimethylamino group containing non-diphenylcarbinol solubility suppressing compounds (examples G–J).

The infrared (IR) absorbing compound serves the function of absorbing the infrared imaging radiation to produce heat. This heat disrupts the secondary forces between the dehydrated diphenylcarbinol compound and the hydroxy groups on the polymer, restoring solubility of the coating in aqueous alkali developing solutions. The heat also assists the regeneration of the diphenylcarbinol compound through addition of water. The IR absorbing compound may also generate secondary forces with the hydroxy groups on the polymer further reducing the solubility of the coating in aqueous alkali developing solutions.

The infrared radiation absorbing compounds useful in the invention are those which have an absorption wavelength that is at its maximum in the region above the visible or ultraviolet region, i.e. above about 750 nm. More particularly, the compounds have a maximum absorption wavelength from about 800 to about 1100 nm. Most preferably, the imaging of the invention is carried out with an 830 nm laser so the maximum absorption wavelength should be in that region. Such compounds are typically dyes that are well known in the art and commercially available. Classes of materials that are useful include, for example, squarylium, croconate, cyanine, phthalocyanine, merocyanine, chalcogenopyryloarylidene, oryindollizine, quinoid, indolizine and pyrylium. Other classes include thiazine, azulenium and xanthene dyes. It should be noted that 4,4'-bis(dimethylamino)benzhydrol is not an infrared radiation absorbing compound as the only absorption present is below 400 nm and there is substantially no absorption in the range of 400 nm to 900 nm.

Typically the IR absorbing dyes employed in coatings for positive working thermal printing plates are in the form of salts. One typically used IR dye is 2-[2-[2-chloro-3-[2-(1,3-dihydro-1,13-trimethyl-2H-benzo[e]-indol-2-ylidene)-ethylidene]-1-cyclohexen-1-yl]-1,1,3-trimethyl-1 H-benzo(e)indolium 4-methylbenzenesulfonate, (dye KF 1151 available from Honeywell Specialty Chemicals).

It has surprisingly been found that using non-ionic IR absorbing dyes such as 5-[2,5-bis-[2-(1,1,3-trimethyl-1,3-dihydro-benzo[e]indol-2-ylidene)-ethylidene)-cyclopentylidene]-1,3-dimethyl-2-pyriminidine-2,4,6-trione (dye S 0325 available from FEW Chemicals Gmbh) in the inventive coating comprising phenol formaldehyde resin and a solubility suppressing diphenylcarbinol compound exhibits even further enhanced manufacturing and shelf life latitude as compared to the same coating using an equimolar quantity of an ionic (salt type) IR absorbing dye. No advantage was found for using the non-ionic dyes with solubility suppressors that were not diphenylcarbinol compounds.

EXAMPLE 4

Test Comparing Ionic IR Dye (KF 1151) to Non-Ionic IR Dye (S 0325) with Diphenylcarbinol Solubility Suppressor The following stock solution is prepared

| Chemical | Amount |
|---|---|
| Arcosolv PM | 373.92 |
| DMF | 32.00 |
| Ethanol | 252.00 |
| HPN (43.18% in PM) | 137.20 |
| BYK 344 | 0.64 |
| PS 105 | 0.76 |
| 4,4'-bis(dimethylamino)benzhydrol (MH) | 1.12 |
| Total | 797.64 |

All materials have been previously described. Coatings were prepared from the stock solution per the following

| Component | Amount |
|---|---|
| Stock solution | 99.565 |
| IR absorbing dye | $2.52 \times 10^{-4}$ moles |
| Arcosolv PM | to 100.000 |

| Coating | IR Absorbing dye | Amount |
|---|---|---|
| M | KF 1151 (ionic) | 0.19 |
| N | S 0325 (non-ionic) | 0.17 |

Plates were coated and dried for 4 and 6 minutes at 1000° C., as in EXAMPLE 1. Plates were exposed and developed and the a* values measured as in EXAMPLE 1. Results are as follows.

| | | a* Value | |
|---|---|---|---|
| Plate | IR Absorbing dye | 4 Min Dry | 6 Min Dry |
| M | KF 1151 (ionic) | −0.52 | −0.51 |
| N | S 0325 (non-ionic) | −0.34 | −0.36 |

Both coatings produce excellent non-image area results, although the results using the non-ionic S 0325 dye (plate N) are better.

Plates are then subjected to a 16 hour 60° C. accelerated aging test that duplicates approximately 18 months storage at ambient conditions. After the aging test the plates were exposed and developed and the a* values measured as in EXAMPLE 1.

| | | a* Value | |
|---|---|---|---|
| Plate | IR Absorbing dye | 4 Min Dry | 6 Min Dry |
| O | KF 1151 (ionic) | −0.65 | −1.35 |
| P | S 0325 (non-ionic) | −0.44 | −0.43 |

Both plates produce very good results when the drying time is 4 minutes. However, plate O with the ionic KF 1151 dye produces results between marginal and unacceptable when the drying time is 6 minutes. On the other hand, plate P with the non-ionic S 0325 dye still produces very good results when the drying time is 6 minutes. In fact, the results for plate P after the accelerated aging test are better than the results for plate O prior to the accelerated aging test. This indicates that the use of a non-ionic dye with a diphenylcarbinol solubility suppressor surprisingly broadens the manufacturing latitude of the plate.

EXAMPLE 5

Test Comparing Ionic IR Dye (KF 1151) to Non-Ionic IR Dye (S 0325) with a Triphenylcarbinol Solubility Suppressor The following stock solution is prepared.

| Chemical | Amount |
|---|---|
| Arcosolv PM | 679.84 |
| DMF | 64.00 |
| Ethanol | 504.00 |
| HPN (44.6% in PM) | 265.60 |
| BYK 344 | 1.28 |

-continued

| Chemical | Amount |
|---|---|
| Bis-(4-[dimethylamino]phenyl)-phenylcarbinol (MGCB) | 2.24 |
| Total | 1516.96 |

All materials have been previously described. Coatings were prepared from the stock solution per the following.

| Component | Amount |
|---|---|
| Stock Solution | 94.81 |
| IR absorbing dye | $2.52 \times 10^{-4}$ moles |
| Arcosolv PM | to 100.00 |

| Coating | IR Absorbing Dye | Amount |
|---|---|---|
| Q | KF 1151 (ionic) | 0.19 |
| R | S 0325 (non-ionic) | 0.17 |

Plates were coated and dried for 4 and 6 minutes at 100° C. as in EXAMPLE 1. Plates were exposed and developed and the a* values measured as in EXAMPLE 1. Results are as follows.

| | | a* Value | |
|---|---|---|---|
| Coating | IR Absorbing Dye | 4 Min Dry | 6 Min Dry |
| Q | KF 1151 (ionic) | −1.49 | −1.48 |
| R | S 0325 (non-ionic) | −1.37 | −1.39 |

The a* values are between marginal and unacceptable even without subjecting the plates to the accelerated aging test. No advantage is seen in using the non-ionic S 0325 dye with a solubility suppressor that is not a diphenylcarbinol.

EXAMPLE 6

Test Comparing Plate Coating with and without DNQ's

The following stock solution is prepared.

| Chemical | Amount |
|---|---|
| Arcosolv PM | 187.46 |
| DMF | 16.00 |
| Ethanol | 126.00 |
| HPN (43.18% in PM) | 68.60 |
| BYK 344 | 0.32 |
| 4,4'-bis(dimethylamino)benzhydrol | 0.56 |
| IR absorbing dye S 0325 | 0.68 |
| Total | 399.62 |

All materials have been previously described. The following coatings were prepared from the stock solution.

Coating S (without DNQ

| Component | Amount |
| --- | --- |
| Stock Solution | 99.905 |
| Arcosolv PM | 0.095 |
| Total | 100.000 |

Coating T (with DNQ)

| Component | Amount |
| --- | --- |
| Stock Solution | 99.905 |
| PS 105 | 0.095 |
| Total | 100.000 |

Plates were coated and dried for 6 minutes at 100° C. as in EXAMPLE 1. Plates were exposed and developed as in EXAMPLE 1. Both plates produce the same reproduction quality and non-image area properties. The temperature of the developer in the processor was then raised to 28° C. Plates were exposed and developed at this temperature. The non-image area of both plates remained excellent, however subjective viewing of the image of plate S (without DNQ) showed somewhat reduced dot values, in particular in the highlight dots and somewhat less well defined edges on solid images. Plate T (with DNQ) did not show these problems. Similar results were obtained when the temperature of the developer was returned to 24° C., but the dwell time was increased to 30 seconds.

PS 105, an ester of 1,2-napthoquinone-(2)-diazido-5-sulfonic acid and a p-cresol resin available from Koyo Chemicals Inc. when added to the inventive coating composition produced a plate which showed increased development latitude (development time and temperature) relative to a plate which did not contain the PS 105. The structure of PS 105 is shown below.

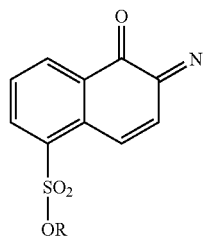

where R is a cresol polymer. Other DNQ's, for example where R is a monomeric, oligomeric moiety or polymeric moiety that can be esterified to the sulfonic acid group are expected to produce the same effect.

The results of EXAMPLE 6 indicate that the addition of DNQ's to plates with diphenylcarbinol solubility suppressors in combination with non-ionic dyes produces lithographic plates with even further increased latitude with regards to developing conditions of the exposed plate.

While preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and scope of the present invention.

What is claimed:

1. A positive working infrared sensitive composition prepared by combining at least the following materials:

a hydroxy substituted polymer;

a diphenylcarbinol solubility suppressor having the structure

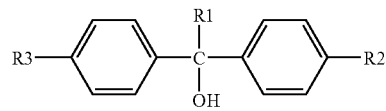

wherein R1 is selected from H, alkyl and acyclic,

R2 and R3 are each independently selected from H, $NO_2$, alkyl, acyclic, alkoxy, —O-acyclic, amino, alkylamino, —N(H)acyclic, dialkylamino, —N(acyclic)$_2$, aryl, arylamino, diarylamino, a carbon ring structure, a carbocyclic ring, a heterocyclic ring and a heteroaromatic ring; and an infrared sensitive chemical having an absorption wavelength maximum in the range of about 800 nm to about 1100 nm;

wherein the composition before exposure to radiation having a wavelength in the range of about 800 nm to about 1100 nm has a first solubility in aqueous alkaline solutions and the composition after exposure to radiation having a wavelength in the range of about 800 nm to about 1100 nm has a second solubility in aqueous alkaline solutions that is greater than the first solubility.

2. The composition of claim 1 wherein R2 and R3 are each independently selected from alkyl, acyclic, aryl, alkoxy, —O-acyclic, amino, dialkylamino or —N(acyclic)$_2$.

3. The composition of claim 1 wherein the diphenylcarbinol solubility suppressor is selected from at least one of 4,4'-bis(dimethylamino)benzhydrol, benzhydrol and 4,4'-dimethoxybenzhydrol.

4. The composition of claim 1 wherein the hydroxy substituted polymer is selected from at least one of phenol formaldehyde novolac resins, cresol formaldehyde novolac resins, phenol formaldehyde resole resins, cresol formaldehyde resole resins and polyvinyl resins with phenolic hydroxide groups.

5. The composition of claim 1 wherein the infrared sensitive chemical is non-ionic.

6. The composition of claim 1 wherein the infrared sensitive chemical is 5-[2,5-bis-[2-(1,1,3-trimethyl-1,3-dihydro-benzo[e]indol-2-ylidene)-ethylidene)-cyclopentylidene]-1,3-dimethyl-2-pyriminidine-2,4,6-trione.

7. The composition of claim 1 further comprising a diazonaphthoquinone compound.

8. The composition of claim 1 further comprising a diazonaphthoquinone compound having the structure shown below:

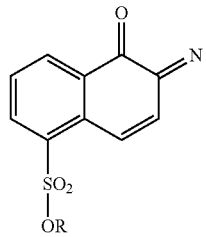

wherein R is selected from a monomeric, oligomeric moiety; a polymeric moiety which can be esterified to the sulfonic acid group; and a cresol polymer.

9. The composition of claim 1 wherein the infrared sensitive chemical is non-ionic and further comprising a diazonaphthoquinone compound.

10. The composition of claim 1 wherein the infrared sensitive chemical is 5-[2,5-bis-[2-(1,1,3-trimethyl-1,3-dihydro-benzo[e]indol-2-ylidene)-ethylidene)-cyclopentylidene]-1,3-dimethyl-2-pyriminidine-2,4,6-trione and further comprising a diazonaphthoquinone compound.

11. The composition of claim 1 further comprising a solvent.

12. A method of making an imaged article comprising:
preparing a positive working infrared sensitive composition by combining at least the following materials:
a hydroxy substituted polymer;
a diphenylcarbinol solubility suppressor having the structure

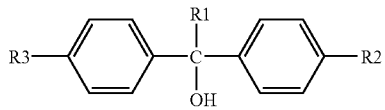

wherein R1 is selected from H, alkyl and acyclic,
R2 and R3 are each independently selected from H, $NO_2$, alkyl, acyclic, alkoxy, —O-acyclic, amino, alkylamino, —N(H)acyclic, dialkylamino, —N(acyclic)$_2$, aryl, arylamino, diarylamino, a carbon ring structure, a carbocyclic ring, a heterocyclic ring and a heteroaromatic ring; and
an infrared sensitive chemical having an absorption wavelength maximum in the range of about 800 nm to about 1100 nm; wherein the composition before exposure to radiation having a wavelength in the range of about 800 nm to about 1100 nm has a first solubility in aqueous alkaline solutions and the composition after exposure to radiation having a wavelength in the range of about 800 nm to about 1100 nm has a second solubility in aqueous alkaline solutions that is greater than the first solubility;
coating a substrate with the positive working infrared sensitive composition;
exposing a portion of the coating to radiation having a wavelength in the range of about 800 nm to about 1100 nm; and
contacting the exposed coating with a developer so that the exposed coating is substantially removed.

13. The method of claim 12 wherein the substrate is selected from a printing plate and a circuit board precursor.

14. The method of claim 12 wherein the substrate is coated with about 100 mg/foot$^2$ to about 300 mg/foot$^2$ of the composition.

15. The method of claim 12 wherein the step of contacting comprises immersing the substrate and exposed coating in the developer.

16. The method of claim 12 wherein the step of contacting comprises applying the developer to the exposed coating without substantially immersing substrate in the developer.

17. The method of claim 12 wherein the diphenylcarbinol solubility suppressor before exposure to radiation chemically changes by losing water and the diphenylcarbinol solubility suppressor after exposure to radiation is chemically regenerated by addition of water.

18. The method of claim 12 further comprising the step of drying the coated substrate.

19. A positive working, infrared sensitive, imageable precursor, comprising:
a substrate comprising a surface;
a positive working infrared sensitive coating applied over the surface, the coating formed by combining at least the following materials:
a hydroxy substituted polymer;
a diphenylcarbinol solubility suppressing compound capable of hydrogen bonding with the hydroxy substituted polymer and capable of losing water when combined with the hydroxy substituted polymer and capable of regenerating water when exposed to radiation having a wavelength in the range of about 800 nm to about 1100 nm; and
an infrared sensitive chemical having an absorption wavelength maximum in the range of about 800 nm to about 1100 nm;
wherein before exposure to radiation having a wavelength in the range of about 800 nm to about 1100 nm the composition has a first solubility in aqueous alkaline solutions and after exposure to radiation having a wavelength in the range of about 800 nm to about 1100 nm the composition has a second solubility in aqueous alkaline solutions that is greater than the first solubility.

20. The positive working, infrared sensitive, imageable precursor of claim 19 wherein the solubility suppressing compound has the structure

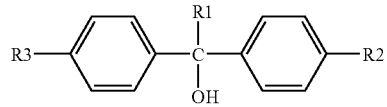

wherein R1 is selected from H, alkyl and acyclic; and
R2 and R3 are each independently selected from H, $NO_2$, alkyl, acyclic, alkoxy, —O-acyclic, amino, alkylamino, —N(H)acyclic, dialkylamino, —N(acyclic)$_2$, aryl, arylamino, diarylamino, a carbon ring structure, a carbocyclic ring, a heterocyclic ring and a heteroaromatic ring.

21. The positive working, infrared sensitive, imageable precursor of claim 19 wherein the hydroxy substituted polymer is selected from at least one of phenol formaldehyde resin and cresol formaldehyde resin; the solubility suppressing compound is selected from at least one of 4,4'-bis(dimethylamino)benzhydrol, benzhydrol and 4,4'-dimethoxybenzhydrol; the infrared sensitive chemical is non-ionic; and the positive working infrared sensitive coating further comprises a diazonaphthoquinone compound.

* * * * *